United States Patent [19]

Deminet et al.

[11] 4,234,351
[45] Nov. 18, 1980

[54] PROCESS FOR FABRICATING GLASS-ENCAPSULATED SOLAR CELL ARRAYS AND THE PRODUCT PRODUCED THEREBY

[75] Inventors: Czeslaw Deminet, Kent; Richard E. Oettel, Seattle, both of Wash.

[73] Assignee: The Boeing Company, Seattle, Wash.

[21] Appl. No.: 924,733

[22] Filed: Jul. 14, 1978

[51] Int. Cl.² .................... H01L 31/04; H01L 31/18
[52] U.S. Cl. ...................................... 136/251; 29/572; 65/41; 65/44; 65/45
[58] Field of Search ........... 29/572; 136/89 EP, 89 P; 65/45, 44, 41, 66, 106

[56] References Cited

U.S. PATENT DOCUMENTS

| | | | |
|---|---|---|---|
| 2,222,788 | 11/1940 | Touceda et al. | 136/89 |
| 4,083,097 | 4/1978 | Anagnostou et al. | 29/572 |
| 4,097,308 | 6/1978 | Klein et al. | 136/89 H |
| 4,152,535 | 5/1979 | Deminet et al. | 136/89 TF |

OTHER PUBLICATIONS

J. A. Minucci et al., "Integral Glass Sheet Encapsulation for Terrestrial Panel Applications", *Conf. Record, 12th IEEE Photovoltaic Specialists Conf.*, (1976), pp. 309-312.

*Primary Examiner*—Aaron Weisstuch
*Attorney, Agent, or Firm*—Cole, Jensen & Puntigam

[57] ABSTRACT

The process includes the steps of (1) forming a pattern of indentations and adjacent boundary ridges in a base layer of glass which is heated to a temperature where it is formable but not flowing, (2) depositing electrically conducting first connecting elements on the upper surface of the base glass layer, with each first connecting element extending from an indentation to a point on an adjacent ridge, (3) positioning a solar cell into each indentation in the base glass layer in such a manner that the lower surface of the solar cell comes in electrical contact with one end of a first connecting element, (4) depositing electrically conducting second connecting elements which extend between the end of the first connecting elements on a ridge to the top surface of a solar cell in an adjacent indentation, and (5) forming a top glass layer which is in intimate contact with the product of steps 1-4. The product produced thereby is an array of glass-encapsulated solar cells which are electrically connected together by means of the first and second connecting elements but are otherwise physically isolated from each other by the glass-encapsulation.

12 Claims, 12 Drawing Figures

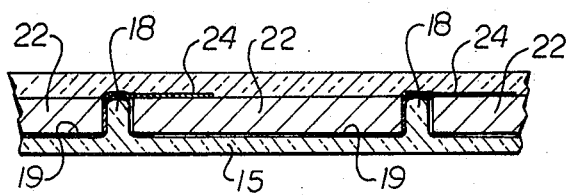
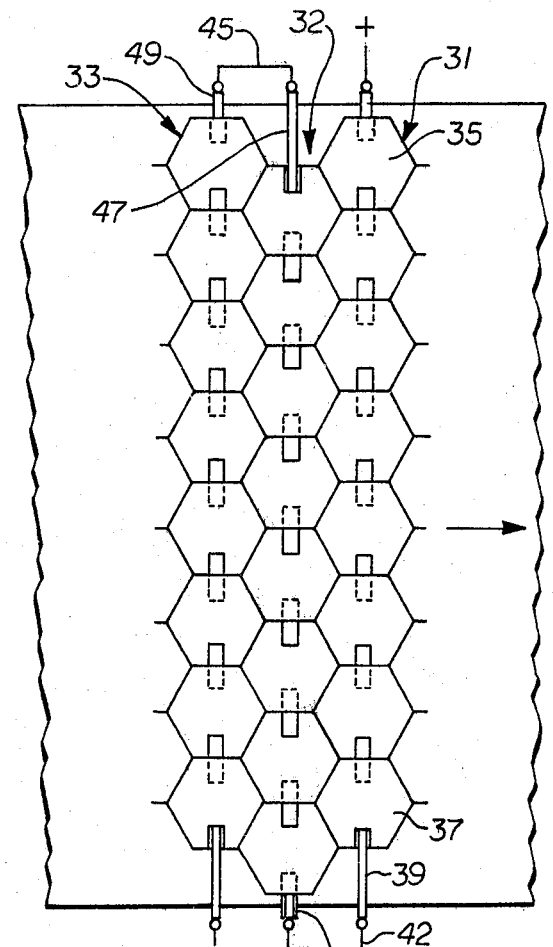
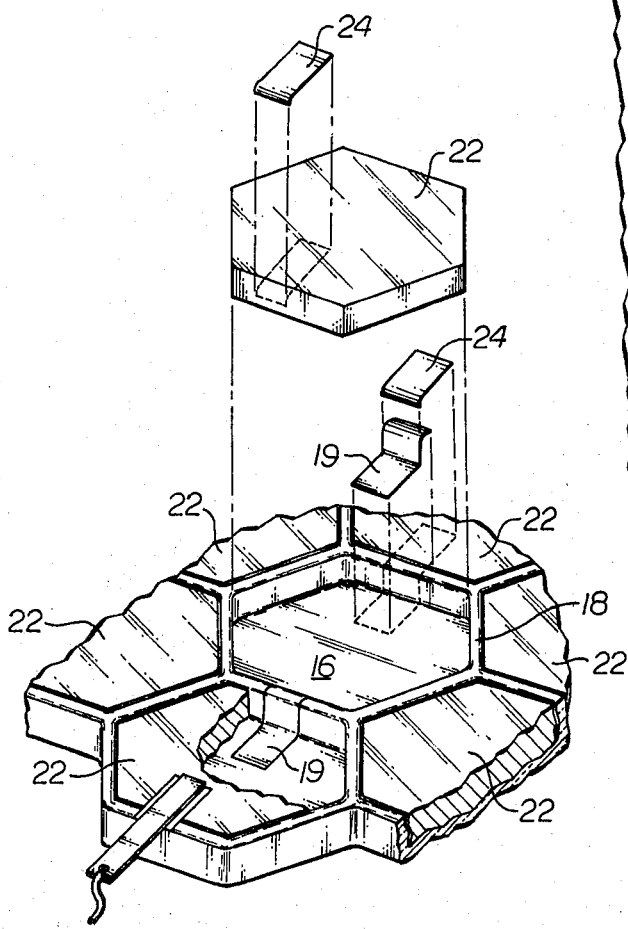

PROCESS FOR FABRICATING GLASS-ENCAPSULATED SOLAR CELL ARRAYS AND THE PRODUCT PRODUCED THEREBY

BACKGROUND OF THE INVENTION

This invention relates generally to the art of fabricating arrays of solar cells and more particularly concerns a process of producing glass-encapsulated solar cell arrays, and the product produced by the process.

Solar cells are becoming increasingly important as a source of electrical energy. The first significant commercial application of solar cells has been as a source of power for space vehicles, and the major thrust of the research and development in solar cell technology has been for space applications.

Because of current and predicted future energy shortages, terrestial applications of solar cell technology are being extensively studied. One limiting characteristic of conventional solar cells, however, is their relatively low voltage output; i.e. typically around 0.5 volt per cell. The relatively large voltages necessary for most terrestial applications thus requires the connection of solar cells into large arrays. The solar cells themselves can be manufactured economically, but the construction of an array, in which individual solar cells are connected together in a specified pattern to produce a given level of power at a specified voltage, is expensive. At least part of the process is carried out in a vacuum. Other steps in the process must be done by hand. These requirements raise the cost of the resulting array to the point where solar cell arrays are no longer competitive with other forms of energy production.

Besides the cost of interconnection, solar cell arrays for terrestial applications must be protected in some manner from the harsh effects of the terrestial environment, i.e. ultraviolet radiation, rain and dust. The conventional approach has been to enclose the arrays with a protective shield, adding further expense to the arrays. Conventional enclosures, however, have several disadvantages. They are difficult and expensive to manufacture and they themselves are susceptible to breakage. Furthermore, if the enclosure is broken or cracked, the entire array will usually be subject to contamination, not just the local area of the break. This usually necessitates the replacement of the complete array.

Accordingly, it is a general object of the present invention to provide a process for producing solar cell arrays and the product produced thereby which overcome one or more of the disadvantages of the prior art noted above.

It is another object of the present invention to provide such a process and product which decreases significantly the cost of producing solar cell arrays.

It is a further object of the present invention to provide such a product which includes a protective enclosure in which any contamination resulting from a break in the enclosure is confined to the area of the break.

It is an additional object of the present invention to provide such a process by which solar cell arrays may be produced continuously.

It is yet another object of the present invention to provide such a process which may be accomplished without human intervention.

It is a still further object of the present invention to provide such a process which may be carried out without a vacuum.

SUMMARY OF THE INVENTION

Accordingly, the present invention is a process for fabricating solar cell arrays, which comprises the following steps: (1) forming a base layer of glass; (2) forming a pattern of indentations bounded by ridges in the base layer; (3) forming an electrically conducting first connecting element on the base layer, wherein the first connecting element extends from a given indentation to a point on an adjacent ridge; (4) positioning a solar cell in the given indentation so that the lower surface of the solar cell is in electrical contact with the one end of the first connecting element in the given indentation; (5) forming an electrically conducting second connecting element which extends between the other end of the first connecting element on the adjacent ridge and the top surface of a solar cell in an adjacent indentation; and (6) forming a top layer of glass on the product of steps 1–5.

Further, the invention includes the product produced by the process described above, and the product comprising: a base layer of glass which has at least two indentations therein which are bounded by ridges. Solar cells are positioned in the indentations. First and second electrically conducting elements are provided to connect the two solar cells together into an array. The first element is positioned on the base layer of glass and extends from a beginning point in one of said indentations between the base layer of glass and the lower surface of the solar cell to a termination point on the ridge. The second connecting element extends between the first connecting element and the top surface of the other solar cell.

DESCRIPTION OF THE DRAWINGS

A more thorough understanding of the invention may be obtained by a study of the following detailed description taken in conjunction with the accompanying drawings in which:

FIG. 6 is a diagram showing a section view of the product produced by the process of FIG. 1.

FIG. 7 is an exploded view of a portion of the array produced by the process of FIG. 1.

FIG. 8 is a diagram showing one manner of connecting hexagonal solar cells together in a series array using the process of FIG. 1.

DESCRIPTION OF THE PREFERRED EMBODIMENT

Figure 1:
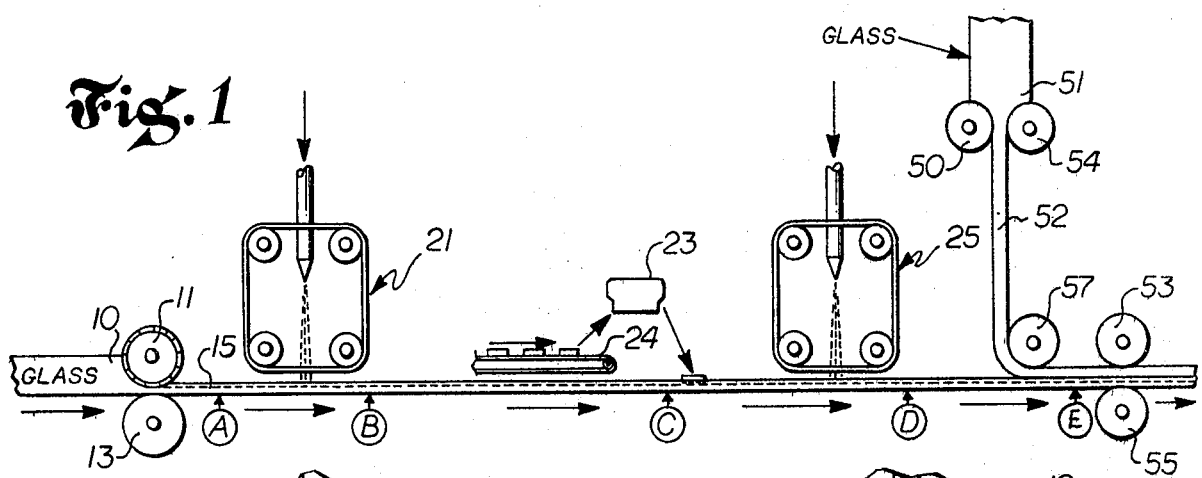
FIG. 1 is a schematic view showing in general the steps of the process of the present invention.

Referring now to FIG. 1, a tank or reservoir of molten glass 10 is passed through water cooled rollers 11 and 13 to form a base glass layer 15 for the solar cell array product. Downstream of rollers 11 and 13, the base glass layer 15 is at a temperature where it is formable, but does not flow. The glass comprising base glass layer 15 has a coefficient of thermal expansion which substantially matches that of the material comprising the solar cells, usually silicon, to be used in the arrays. The glass is also relatively pure so that the solar cell material will not be contaminated by the process. Two types of commercially available glass which fulfill the above requirements are two borosilicate glasses, one having the following approximate composition 81% of $SiO_2$, 12% of $B_2O_3$, 2% of $Al_2O_3$ and 4% of $Na_2O$, 1% trace elements, the other having the following approximate composition, 70% of $SiO_2$, 20% of $B_2O_3$, 6% of $Al_2O_3$ and 4% of $Na_2O$.

If the 20% boron oxide glass noted above is used in the process, it will be at approximately 1200° C. prior to entering rollers 11 and 13, and approximately 565° C. downstream of the rollers, due to the cooling effect of the rollers, which are usually cooled by water. The base glass layer 15 is approximately ⅛ inch thick, and may, of course, be of various widths. As an example, a convenient width is approximately one meter. The rate of production of the base layer may also vary, although, again by way of example, a rate of two meters per minute is readily attainable.

The upper roller 11 is patterned, so that the negative of the pattern is reproduced in the upper surface of the base glass layer 15. The configuration and size of the indentations in base glass layer 15 due to the action of roller 11 will depend upon the configuration and size of the solar cells which are to be used in the array, since the solar cells will be positioned in the indentations. The configuration of the solar cells shown and described herein is hexagonal, approximately four inches, on the diagonal, in size. Such solar cells are currently commercially available.

Figure 2A:
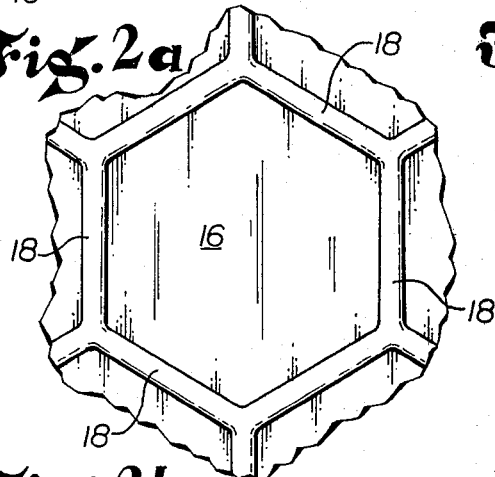
FIGS. 2a and 2b are diagrams showing the condition of the product produced by the process of FIG. 1 at point A in FIG. 1.
Figure 2B:
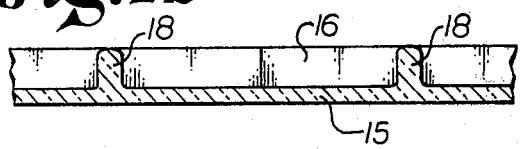

The indentation pattern in the upper surface of the base glass layer, referring to FIGS. 2a and 2b, is thus hexagonal, to accommodate the hexagonal solar cells. The indentations are bounded by relatively thin, upstanding ridges 18. FIGS. 2a and 2b show a portion of the patterned base glass layer in plan and section views, respectively. In the embodiment shown, the solar cells are approximately 8/1,000ths inches thick, and hence, the depth of the indentations 16 in the base glass layer is at least that great. The ridges 18 are configured to be as narrow as possible, so that a maximum number of solar cells can be accommodated in a given area. The arrangement of the indentations and the ridges assure proper and accurate positioning and indexing of the solar cells in the array, an important aspect of the present process.

At the end of the first step of the process, i.e. at point A in the process shown in FIG. 1, the indented base glass layer portion of the final product has been formed. The temperature of the base glass layer at this point is permitted to decrease to somewhat less than 600°, in the case of 20% boron glass, at which point it is not sufficiently hot to flow but is formable and will not crack due to thermal shock caused by other steps in the process.

The second step in the process of the present invention, which occurs at point B in FIG. 1, is the deposition of a set of first connecting elements or tabs 19 on the indented top surface of base glass layer 15. The first connecting elements 19 are bonded to the top surface of base glass layer 15 and extend between each indentation and approximately the top of the adjacent ridge bounding the indentation.

Figure 3A:
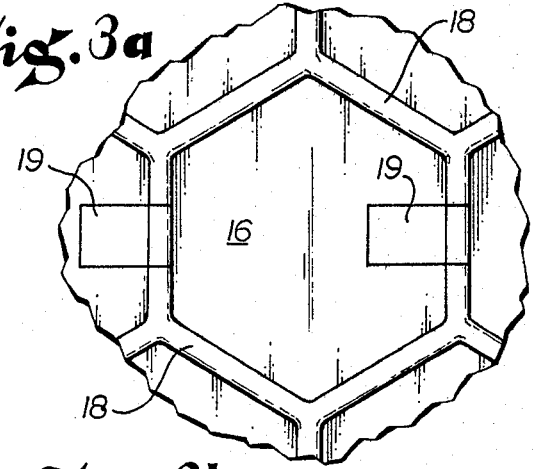
FIGS. 3a and 3b are diagrams showing the product at point B in the process of FIG. 1.
Figure 3B:
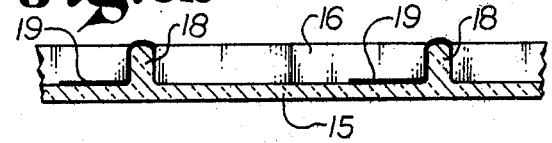

The first connecting elements 19 are deposited on the base glass layer through an endless belt mask 21 by, for instance, a plasma spray technique. The use of the plasma spray permits the process of the present invention to be carried out in the atmosphere, not in a vacuum, as is the case with some methods. This saves considerable expense, and reduces the complexity of the process. The openings in the mask 21 are arranged properly relative to the indentations and the ridges so that a first connecting element is deposited between each indentation in which a solar cell is to be positioned and an adjacent ridge. Plan and section views of a portion of the array, showing first connecting elements 19 in place, comprise FIGS. 3a and 3b.

Figure 4A:
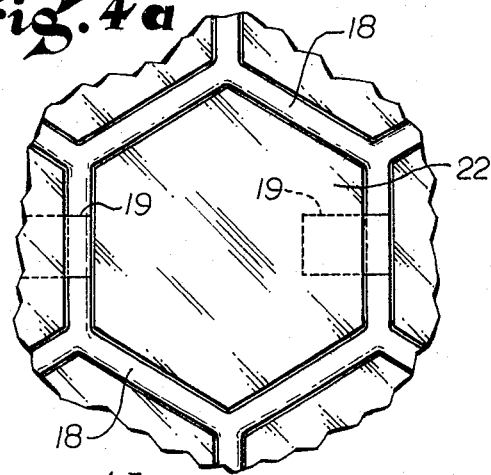
FIGS. 4a and 4b are diagrams showing the product at point C in the process of FIG. 1.
Figure 4B:
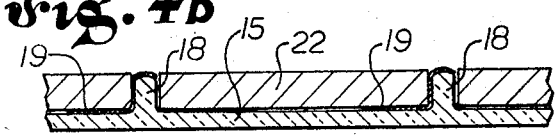

The first connecting elements vary in size, but for the configuration shown, such elements will begin at a point in the indentation approximately one tenth of the cell dimension, continue to the edge of the indentation, and then up the side of the adjacent ridge to approximately the top thereof. The elements 19 are approximately 0.4 inches long, 0.6 inches wide and comprise a metal film approximately 0.001 inches thick. These dimensions could vary, however, especially the width, as the elements could easily be configured to extend over a wider portion of the solar cells. The material used for the elements 19 may vary, although a silver titanium alloy will work well. The next step in the process, shown at point C in FIG. 4, is the placement of solar cells 22 in the indentation 16, shown more specifically in FIG. 4a and 4b. Since the base glass layer 15 is still at a formable temperature, i.e. approximately 600° for the 20% Boron glass, the solar cells, prior to their placement in the indentations in the base glass layer, are preheated to avoid thermal shock.

Although the placement of the cells 22 in the indentations 16 could be accomplished in many different ways, including manually, one possible way is by an automated arm or robot arrangement which is shown schematically at 23 in FIG. 1. The solar cells 22 may be moved to the moving base glass layer 15 by means of a conveyor or similar device 24, from which by means such as a vacuum suction device (not shown), the robot arm 23 can move the cells into their places in the indentations. When the solar cells 22 are properly positioned in indentations 16, there is a good electrical contact between the metalized connection on the bottom of the solar cell and the first connecting element, and a good molecular bond between the solar cell and the base glass layer. The solar cell 22 typically will have a somewhat smaller diameter than the diameter of the indentation, so that there will be a small space between the edge of the solar cell and the ridge bounding the indentation. This relationship is shown clearly in FIGS. 4a and 4b.

At this point in the process, the solar cells 22 have been positioned in, and are bonded to, the base glass layer 15, and there is an electrical connection between the matalized portion of the lower surface of each solar cell and the first connecting element.

Figure 5A:
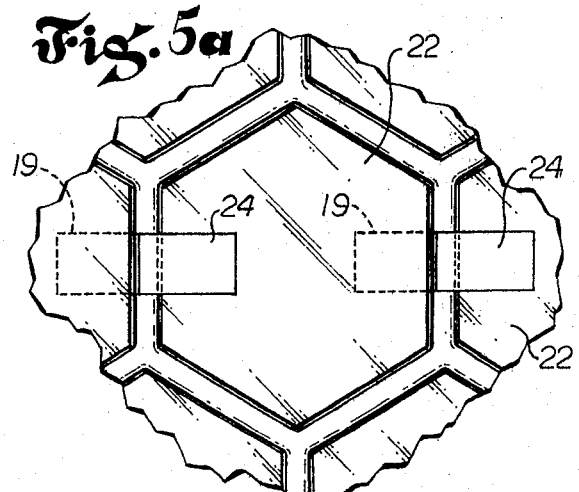
FIGS. 5a and 5b are diagrams showing the product at point D in the process of FIG. 1.
Figure 5B:
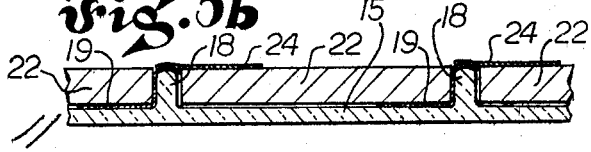

The next step in the process, shown at point D in FIG. 1, is the deposition of the second connecting elements, the result of which is shown in FIGS. 5a and 5b. The second connecting elements or tabs 24 complete the electrical connection between adjacent solar cells, as they extend between the free ridge end of the first connecting element and the metalized portion of the upper surface of the adjacent solar cell. At the conclusion of this step, the individual solar cells have been electrically connected into an array.

This step is similar to the deposition of the first connecting elements and is also accomplished by an endless belt mask 25, which is similar to mask 21. Mask 25 has openings similarily sized to that of the mask 21, but arranged slightly differently, so that the resulting second connecting elements extend between the ridge end of a first connecting element and the metalized portion of the top surface of an adjacent solar cell.

The second connecting elements, in configuration and structure, are similar to the first connecting elements. The first connecting elements are irregular in shape, as they extend from an indentation to a ridge. The second connecting elements, however, are substantially horizontal, as they extend from the ridge end of a first connecting element to the top surface of an adjacent solar cell. This relationship is shown clearly in FIGS. 5a and 5b.

At this point in the process, the electrical connections between the solar cells are complete, and the resulting array is capable of operating. The electrical configuration of a given array will depend upon the arrangement of the connecting elements. The solar cells may be connected in a parallel arrangement, a series arrangement or a parallel/series arrangement. Exterior circuit connections may be provided at selected intervals along the length of the array.

Referring to FIG. 8, a series arrangement of hexagonal solar cells is shown. The arrangement shown in FIG. 8 comprises a pattern of adjacent rows of hexagonal solar cells transverse to the direction of movement of the base glass layer 15. Rows 31, 32 and 33 of solar cells 22 are shown, with the solar cells in each row connected in series, so that if each cell produces 0.5 v, each row of cells would produce approximately 4 volts. Each solar cell located on the respective edges of the base glass layer 15, e.g. cells 35 and 37 in row 31, have electrically conducting circuit connectors 39 which extend past the edge of the base layer to facilitate electrical connection to exterior circuitry or connection to other rows of solar cells. Other configurations of external electrical conductors, such as bus bars, may be used, depending on the electrical configuration of the array.

In FIG. 8 a series connection of rows 31, 32 and 33 is achieved by an external connection 42 between connectors 39 and 43 and another external connection 45 between connectors 47 and 49. A series array of 24 cells results. Other array configurations are, of course, possible by varying the number of cells in each row, varying the number of rows of cells, and varying the electrical connections between the rows. The actual electrical configuration of a particular array will depend on the desired voltage and current output of the array.

The next step in the process, which is shown at point E in FIG. 1, is the forming of a top glass layer and the joining of the top glass layer to the product of the previous steps in the process. The result of this step is shown in FIG. 6.

Referring to FIG. 1, sheet of glass 52 is formed from a tank or reservoir 51 of molten glass by rollers 50 and 54. The top glass sheet 52, when it emerges from rollers 52 and 54, is still quite hot, approximately 1100°–1200° C., so that it is capable of flowing, which is important for reasons discussed hereinafter. The top glass sheet 52 extends down vertically from rollers 50 and 54, with the height of the rollers from the base glass layer being dependent on the desired viscosity, i.e. flowability, of the glass comprising the top sheet.

In the embodiment shown, the rollers 50 and 54 are 2–3 feet above the base glass layer 15.

The top glass layer 52 is directed around roller 57, where it comes into contact with the product of the previous steps A–D.

The low viscosity glass fills in, around and over the solar cells, the connecting elements, and the base glass layer. Pressure is added by forming rollers 53 and 55, resulting in a molecular bond between the top and base glass layers, the solar cells and the connecting elements.

The time period during which pressure is applied through forming rollers 53, 55 during the formation of the top glass layer is carefully controlled, e.g. within a few seconds, so that the PN junction which is already present in the solar cell at a relatively shallow depth, does not migrate deeper into the cell, which would result in a decrease in solar cell efficiency.

Most modern solar cells have a texturized, antireflective upper surface which is a molecular surface configuration which minimizes reflection. With conventional solar cell arrays, the protective surface of the array only superficially covers, if at all, the surface area of the solar cells, leaving air gaps between the texturized surface and the protective surface.

By using glass at elevated temperatures, however, under pressure, the vicosity is sufficiently low to result in a continuous physical bond between the surface of the solar cell and the protective surface.

The resulting product is shown in section view in FIG. 6 and in an exploded view in FIG. 7. FIG. 7, in particular, clearly shows each of the individual portions of the product of the present invention and its physical relationship to the other portions.

After the top layer has been formed, the resulting array is annealed to remove the molecular material strain in the product caused by the manufacturing process. The annealing step completes the process of the present invention, and the resulting product is ready to be cut into arrays of desired size and configuration.

The above described series of steps results in an array of solar cells which are each completely encapsulated by glass, and thus physically isolated from each other. Electrical connection in the array is provided by the first and second connecting elements. Thus, damage to one region of the array wll only affect the local solar cells, and not the entire array. Hence, the encapsulated solar cell array structure of the present invention will have a significantly longer terrestrial useful life than present arrays.

In addition, the automated vacuumless process disclosed herein reduces the cost of producing solar cell arrays by a significant amount, thus making solar cell arrays more practical compared to other forms of producing electrical energy.

Although an exemplary embodiment of the present invention has been disclosed herein for purposes of illustration, it should be understood that various changes, modifications and substitutions may be incorporated in such embodiment without departing from the spirit of the invention as defined by the claims which follow.

What is claimed is:

1. A process for fabricating solar cell arrays, comprising the steps of:
 a. forming a base layer of glass;
 b. forming a pattern of indentations bounded by ridges in said base layer;
 c. forming an electrically conducting first connecting element on said base layer, wherein said first connecting element extends from a given indentation to a point on an adjacent ridge;

d. positioning a solar cell in said given indentation so that the lower surface of said solar cell is in electrical contact with the one end of said first connecting element in said given indentation;

e. forming an electrically conducting second connecting element to extend between the other end of said first connecting element on said adjacent ridge and the top surface of a solar cell in an adjacent indentation; and f. forming a top layer of glass on the product of steps a-e above by heating glass sufficiently until it flows, applying the flowing glass to the upper surface of the product of steps a-e above so that it fills in the irregularities thereof, and applying sufficient pressure to create an intermolecular bond between said top layer of glass and the exposed portions of the glass base layer, the solar cells and the connecting elements, the application of pressure being sufficiently time-limited to prevent migration of the existing PN junction in the solar cell.

2. The process of claim 1, including the further step of annealing the product of steps a-f of claim 1.

3. The process of claim 1, wherein said base layer of glass and said top layer of glass are at a sufficiently high temperature during the process that they are formable.

4. A process of claim 1, wherein said steps of forming said electrically conducting said first and second connecting elements are accomplished by a plasma spray through a mask.

5. The process of claim 1, wherein the glass comprising said base layer and said top layer has substantially the same coefficient of expansion as the material comprising the solar cell.

6. The process of claim 5, wherein the step of positioning the solar cell in said indentation includes the step of prewarming the solar cell so that it does not experience thermal shock when it comes into contact with said base layer.

7. The product formed by a process for fabricating solar cell arrays which comprises the steps of:

a. forming a base layer of glass;

b. forming a pattern of indentations bounded by ridges in said base layer;

c. forming an electrically conducting first connecting element on said base layer, wherein said first connecting element extends from a given indentation to a point on an adjacent ridge;

d. positioning a solar cell in said given indentation so that the lower surface of said solar cell is in electrical contact with the one end of said first connecting element in said given indentation;

e. forming an electrically conducting second connecting element to extend between the other end of said first connecting element on said adjacent ridge and the top surface of a solar cell in an adjacent indentation; and f. forming a top layer of glass on the product of steps a-e above by heating glass sufficiently until it flows, applying the flowing gas to the upper surface of the product of steps a-e above so that it fills in the irregularities thereof, and applying sufficient pressure to create an intermolecular bond between said top layer of glass and the exposed portions of the glass base layer, the solar cells and the connecting elements, the application of pressure being sufficiently time-limited to prevent migration of the PN junction in the solar cell.

8. A glass-encapsulated solar cell array, comprising:

a base layer of glass having at least two indentations therein which are bounded by ridges;

solar cells positioned in said indentations;

an electrically conducting first connecting element positioned on said base layer of glass so that it extends from a beginning point in one of said indentations between said base layer of glass and the lower surface of said solar cell to a termination point on a ridge bounding said one indentation;

an electrically conducting second connecting element extending between said first connecting element and the top surface of the other solar cell in an adjacent indentation; and a top layer of glass which covers the exposed upper surfaces of said base layer, said solar cells and said first and second connecting elements and is directly bonded thereto in an intermolecular bond.

9. An array of claim 8, wherein said base layer of glass includes a plurality of said indentations, substantially bounded by ridges, each indentation adapted to receive a solar cell.

10. An array of claim 8, wherein the glass comprising said base and top layers has substantially the same coefficient of expansion as the material comprising the solar cells.

11. An array of claim 10, wherein substantially all of the residual strain in the article caused by the manufacture of the article has been relieved.

12. An array of claim 11, wherein said first and second connecting elements are a metal film.

* * * * *